United States Patent [19]

Nishizawa et al.

[11] Patent Number: 4,558,660
[45] Date of Patent: Dec. 17, 1985

[54] SEMICONDUCTOR FABRICATING APPARATUS

[75] Inventors: Jun-ichi Nishizawa; Tadahiro Ohmi, both of Miyagi, Japan

[73] Assignee: Handotai Kenkyu Shinkokai, Japan

[21] Appl. No.: 475,828

[22] Filed: Mar. 16, 1983

[30] Foreign Application Priority Data

Mar. 16, 1982 [JP] Japan .................................. 57-41943

[51] Int. Cl.[4] ............................................ B05C 11/00
[52] U.S. Cl. .................................. 118/725; 118/50.1; 219/411
[58] Field of Search ...................... 118/722, 725, 50.1, 118/642, 643, 641; 219/411; 198/844

[56] References Cited

U.S. PATENT DOCUMENTS 2,820,131 1/1958 Kodama .......................... 118/642 X
4,342,794 8/1982 Völker et al. ................... 118/643 X Primary Examiner—Evan K. Lawrence
Attorney, Agent, or Firm—Sughrue, Mion, Zinn, Macpeak, and Seas

[57] ABSTRACT

A semiconductor fabricating apparatus is capable of fabricating a high quality semiconductor with utilization of crystal growth, thermal oxidation of CVD membrane growth at low temperature. The semiconductor fabricating apparatus includes a reaction chamber having a gas inlet and a gas outlet, an insulative support means disposed in the reaction chamber for supporting semiconductor wafers thereon, an infrared lamp means for irradiating exposed surfaces of the semiconductor wafers and an ultra-violet lamp means for irradiating the exposed surfaces of the semiconductor wafers overlappingly with the infrared irradiation.

4 Claims, 13 Drawing Figures

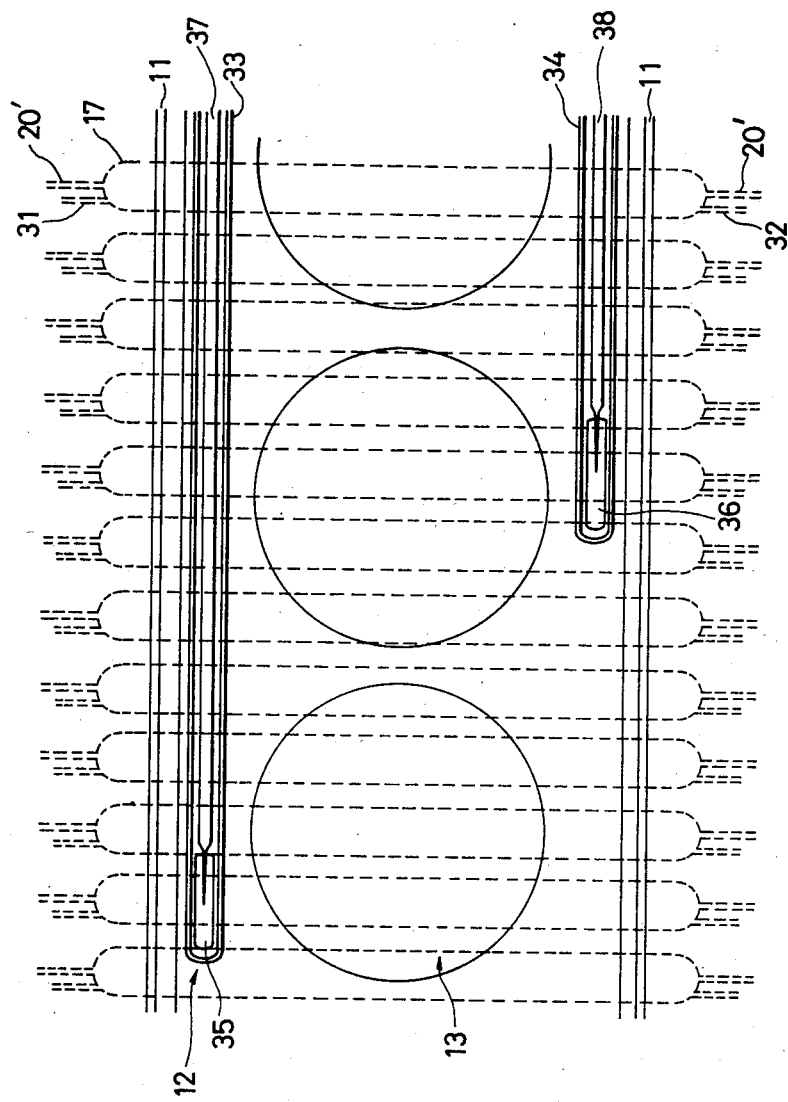

SEMICONDUCTOR FABRICATING APPARATUS

BACKGROUND OF THE INVENTION

The present invention relates to a semiconductor fabricating apparatus capable of fabricating a high quality material by means of crystal growth, thermal oxidation or chemicl vapor deposition (CVD) membrane growth at low temperature.

It has been known that it is possible to fabricate semiconductor layers at very low temperatures when ultra-violet ray irradiation is used along with the gaseous Si growth or with the CVD of a $SiO_2$ or $Si_3N_4$ membrane. When Si is grown in gaseous $SiCl_4+H_2$ atmosphere, the growth is usually achieved at a temperature around 1150°–1200° C. However, when ultra-violet irradiation from a mercury lamp is used during the fabrication process together with, the epitaxial growth of Si can be realized satisfactorily even at a lower temperature around 780°–860° C. (Refer to M. Kuwagawa, J. Nishizawa et al. "Epitaxial Growth with Light Irradiation" J. Appl. Phys. Vol. 7. pp. 1332–1341, 1968.) Further, when the $SiO_2$ or $Si_3N_4$ membrane, which is growing by CVD at a temperature around 700°–900° C., is irradiated with ultra-violet rays from a mercury lamp an atmosphere of a gaseous mixture $Hg+SiH_4+N_2O$ or $Hg+SiH_4+NH_3$, practically useable $SiO_2$ CVD membrane or $Si_3N_4$ CVD membrane can be obtained at a low temperature around 100°–200° C. (Refer to, for example, J. Peter "Low Temperature Photo-CVD oxide Processing for Semiconductor Device Application" Tech. Dig., of 1981 IEDM, pp. 240–243, and J. W. Peter et al. "Low Temperature Photo-CVD Silicon Nitride: properties and applications", Solid State Tech., pp. 121–126, September. 1980.)

SUMMARY OF THE INVENTION

An object of the present invention is to provide a semiconductor fabricating apparatus which is capable of fabricating a high quality material layer on semiconductor wafers at a low temperature by using epitaxial growth, CVD, thermal oxidation or thermal nitridation etc. together with the irradiation of the wafer surfaces and the gaseous atmosphere with a light of a desired wavelength, e.g., a combination of infrared and ultra-violet light.

BRIEF DESCRIPTION OF THE DRAWINGS

FIGS. 1, 3 and 10 show infrared heating ultra-violet irradiating furnaces according to the present invention, respectively;

DETAILED DESCRIPTION OF THE PREFERRED EMBODIMENTS

Figure 1:
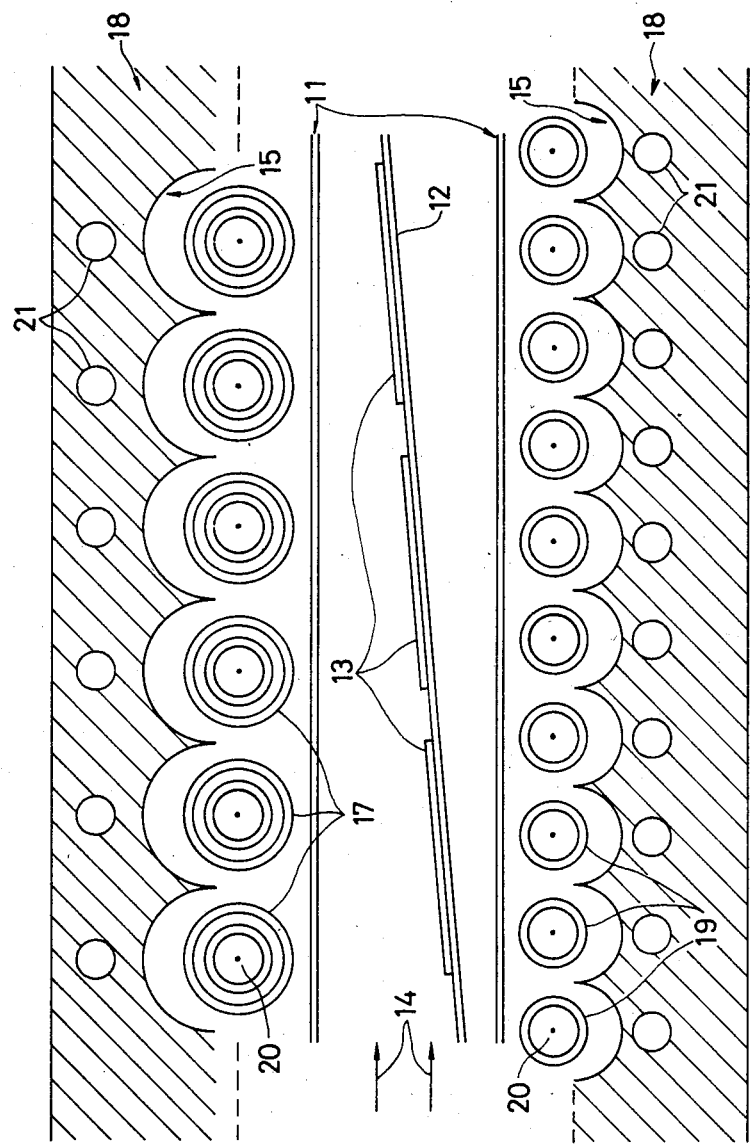

The present invention will be described in detail with reference to the accompanying Drawing, using a process of the fabrication of a silicon semiconductor, as an example. Generally, in any of the semiconductor fabrication processes involving epitaxial growth, thermal oxidation, thermal nitridation, $SiO_2CVD$ or $Si_3N_4CVD$ of silicon, a silicon wafer is heated to a desired temperature to which a desired gaseous mixture flow is supplied so that a desired layer or membrane of silicon is grown on the wafer. FIG. 1 shows in cross section taken along a direction of gas flow, an embodiment of the present apparatus for silicon epitaxial growth, in which the semiconductor wafer is maintained at a desirably elevated level and ultra-violet irradiation of the wafer for promotion of the growing reaction is simultaneously performed. In FIG. 1, a rectangular parallelopiped reaction tube 11 of quartz glass is arranged laterally and an infrared lamp heating means is associated with the reaction tube. In the reaction tube 11, a support 12 in the form of dish of quartz or sapphire is arranged such that a plurality of silicon wafers 13 are disposed thereon. A gas flows through the reaction tube 11 as shown by arrows 14. The gas is a purified gas mixture for growing epitaxially silicon layer on the wafers, such as $H_2+SiCl_4$, $H_2+SiHCl_3$, $H_3+SiH_2Cl_2$ or $H_2+SiH_4$ or any mixture thereof.

The present apparatus further includes a plurality of combination lamps 17 arranged equidistantly along an upper side of the reaction tube 11. Each combination lamp 17 includes a center tungsten filament 20 and concentically arranged double tubes for emitting infrared rays as well as ultra-violet rays. A plurality of infrared ray tubes 19 each including a center tangsten filament 20 are also arranged equidistantly along a lower side of the reaction tube 11.

In order to effectively utilize the radiation energy from the combination lamps 17 and the infrared lamps 19, reflecting blocks 18 are provided such that these blocks 18 constitute reflectors for directing all of radiation energy from the lamps 17 and 19 to the reaction tube 11. Surfaces 15 face the rear sides of the lamps 17 and 19, respectively. The inner surface 15 faces, for example, the combination lamps 17 and is formed with a plurality of substantially parabolic surface portions each of which encircles the rear half of different ones of the combination lamps 17. The surface is coated with gold (Au) or Al-MgF so that radiation rays from each combination lamp 17 reflected by the parabolic surface portion is directed substantially in parallel to the reaction tube 11 effectively.

The reflecting blocks 18 each have a plurality of through-holes 21 through which a coolant such as water flows for cooling thereof.

In the embodiment in FIG. 1, the silicon wafers 13 are directly heated by infrared radiation from the combination lamps 17 and the infrared lamp 19 in contrast to conventional systems. Conventionally, a highly pure silicon or a carbon susceptor coated with SiC layer is disposed on a support and silicon wafers are disposed on the susceptor. Such a susceptor may be used on the support 12 in the present apparatus. However, the infrared ray lamp used to heat the wafer in the present invention may also heat the susceptor whose heat capacity is usually much larger than that of the silicon wafer. Therefore, when the susceptor is heated to, for example, 1050°–1200° C., the reaction tube and the support may be heated to a very high temperature by the radiation heat and conduction heat from the susceptor at the elevated temperature. Substances (silicon, in this case) segregated from the gas mixture by reaction may accumulate on walls of the reaction tube and on the supports, so that the transmission thereof for infrared rays may be reduced gradually during the epitaxial growth of silicon. That is, since the infrared transmissions of the reaction tube and the support are reduced, respectively, the temperature of the silicon wafers on the support may be lowered and the reaction tube and the support may be heated directly by infrared radiation, causing the amount of reaction segregated substance accumulation to be increased and so on. The reaction segregated substance tends to accumulate on the walls of the reaction tube and the support mainly during the process of the epitaxial growth of Si which is to be performed at very high temperature. Therefore, it may be desirable to cool the walls of the reaction tube by, for example, constructing the latter with a double wall structure and flowing a purified inert gas such as $N_2$ through a passage formed between the walls.

Further, when the reaction tube is heated to a high temperature, the material of the evaporation, i.e., quartz whose vapor pressure at 1200° C. is as high as in the order of $10^{-2}$ Torr occurs in addition to the accumulation of the segregated substance. With such evaporation of tube material, as well as evaporation of the susceptor itself, the tube itself become porous causing problems of mixing-in of outside contaminants and oxygen to a growing silicon layer.

The approach of the utilization of the double walled tube structure may be effective to resolve the segregated substance problem. That is, by flowing a gas through the reaction tube capable of etching the reaction segregated substances, it may be possible to remove the segregated evaporated substances accumulated on the inner wall of the tube. For example, in the case of the epitaxial growth of Si, the use of HCl gas may remove the segregated substance on the tube while leaving the epitaxial Si layer on the Si substrate. However, the contamination problems can not be dissolved using this technique.

The water direct heating system according to the embodiment in FIG. 1 is advantageous because only the silicon wafers are substantially heated to a high temperature.

When the silicon wafers are disposed directly on the support 12 as shown in FIG. 1, the temperature of the support 12 may be heated to a temperature nearly equal to the wafer temperature. In order to avoid the accumulation of reaction segregated substance on the support 12, the latter should be shaped such that the gas such as SiCl$_4$ does not contact the rear side of the support 12. Further, in order to restrict possible evaporation of the support 12, the latter should be made of material, such as sapphire, whose vapor pressure is low enough.

Figure 2:
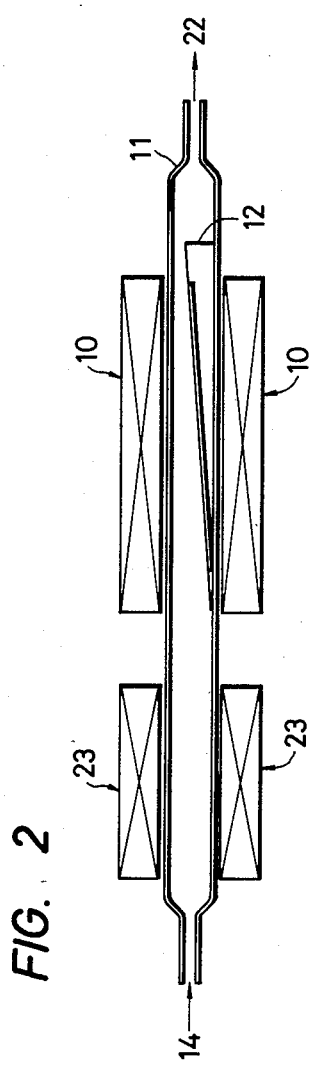
FIG. 2 shows an epitaxial growth furnace utilizing the infrared heating-ultra-violet irradiating furnace of the present invention.

Problems to be considered with the direct heating of the silicon wafers as in FIG. 1 are (1) that the silicon wafers may be cooled since the gas is heated by the wafers when it reaches the wafers, (2) that the silicon wafers must be heated uniformly and (3) that the temperature of the wafers must be measured exactly. As to the problem (1), it may be resolved by providing a resistive electric heating furnace 23 in the upstream side of the infrared heating-ultra-violet irradiating furnace 10 to pre-heat the gas to a temperature slightly lower than the temperature at which the gas reacts or is heat decomposed, before reaching the wafers as shown in FIG. 2. If the gas is one of gases containing SiCl$_4$, the latter may be pre-heated to 600°–700° C. or, in the case of a gas containing SiH$_4$, to 200°–300° C. In FIG. 2 a reference numeral 22 shows an exhaust gas flow. It may be possible in the embodiment in FIG. 2 to dispose a desired number of silicon wafers on an upstream end portion of the support 12 as dummy wafers to further heat the gas heated by the electric furnace 23 and passing over the silicon wafers. In any case since the gas temperature is lower than that of the wafers, the upper surfaces of the wafers are necessarily cooled by the gas flow. When a temperature difference occurs between the upper and a lower surfaces of the wafers, a stress may be produced inside of the wafers. If the stress is very strong, the surfaces of the wafers may be cracked or fine holes (around 0.1–2 $\mu$m in diameter) may be formed thereon. In the embodiment in FIG. 1, since the wafers are heated independently from both surfaces with the infrared radiation, no such problem occurs. With an increased amount of the gas, the infrared radiation to the upper surfaces of the wafers should be increased accordingly to minimize the temperature difference between the upper and lower surfaces of the wafers. It may be possible to increase the infrared radiation intensity in the upstream side of the furnace 10 to compensate for the higher cooling effect of the wafers in the upstream side.

As to the problem (2), the diameters of the infrared lamps 17 and 19 are made small and arranged uniformly with small pitches, respectively. In addition a parabolic reflector 15 is disposed behind each of the lamps 17 and 19 so that substantially parallel infrared radiation from each source with an increased dose is realized, as shown in FIG. 1. It has been found effective to arrange the infrared lamps 19 each having a diameter of 6–12 mm, with a pitch of 10–20 mm, for example. Of course the infrared ultraviolet lamps 17 should be designed as thin as possible. However, when there is no need of high temperature such as epitaxial growth, thermal oxidation or thermal nitridation of silicon or in case of the CVD of SiO$_2$ or Si$_3$N$_4$ membrane, uniform heating may be obtained by slightly increasing the distance between the lamps and the wafers without making the lamps thinner.

In process where a relatively high temperature is required, instead it may be beneficial to reduce the distance between the lamps and the wafers in view of electric power consumption. In the latter case, the amount of infrared and/or ultraviolet radiation tends to vary periodically if the structure is such that where the lamps are arranged periodically in the direction of the gas flow. In order to move this defect, it may be advisable to slowly remove the infrared heating-ultraviolet irradiating furnace in FIG. 1 or 2 periodically along the reaction tube. The spatial period may be several to 10 times the pitch of the infrared lamps, and/or ultraviolet lamps, or more. The recovering velocity may be in the range of 1 mm/sec to 100 mm/sec dependent upon the growing speed of the membrane. When the growing speed is high, the moving velocity should be high correspondingly, otherwise the growth becomes non-uniform. It may be possible to move the furnace at a constant speed and constant period if the furnace is not heating constantly. However, when excess times are required at the turning points of the periodic movement of the furnace, the period should be successively changed to make the amount of the infrared and ultraviolet uniform relative to the wafers at respective positions along the reaction tube. It may be effective to achieve uniform heating to move the lamp heating furnace reciprocatingly for a desired length along the direction of the gas flow.

A measurement of temperature equivalent of the silicon wafers will be described with reference to FIG. 3.

Since the wave length range of radiation rays from the infrared heating lamp spreads generally from about 0.3 μm to around 5 μm, it is very difficult to measure the temperature of the silicon wafer surface by means of the radiation type thermometer. That is, a portion of the infrared radiation from the infrared ray lamps will be reflected from the surface of the silicon wafer and inputted to an input of the thermometer causing an error. Thermocouples can not be put in contact with the wafer surface because thermocouples are exposed in the gas causing a contamination problem. An alternative approach is to put one or more thermocouples in a quartz tube and put the latter in the reaction tube. However, since the thermocouple itself is heated by the infrared radiation, it is impossible to measure the wafer temperature thereby.

According to the present invention, a temperature which is very close to the silicon wafer temperature is measured. FIG. 3 illustrates the present temperature measuring method, in which a number of the infrared and ultra-violet lamps 17 shown by dotted lines are arranged in parallel. Each of the lamps 17 has an electrode 20' connected to a tungsten filament for infrared ray radiation, lead lines 31 and 32 connected to respective opposite ends, that is cathode coated with an oxide and a lead connected to an anode electrode of a discharge tube for generating ultra-violet rays. The reaction tube 11, the support 12 and the silicon wafers 13 are shown by solid lines, respectively.

In FIG. 3, thin quartz or sapphite pipes 33 and 34 are provided above and beneath the support 12. One end of each of the thin pipes is closed to be air-tight and silicon blocks 35 and 36 are disposed around the closed cuts of the quartz pipes 33 and 34, respectively. The surface condition of each silicon block is made as similar to that of the silicon wafer as possible. Silicon blocks are formed with thin holes into which thermocouples 37 and 38 are inserted intimately, respectively. The pipes 33 and 34 are arranged in close relation to the silicon wafers so that the silicon blocks which are the temperature measuring portions are disposed as close to the wafers as possible, while the blocks do not constitute any obstacle for the infrared radiation directed to the wafers.

Temperature measured by the thermocouples in the silicon blocks are arranged closely to the silicon wafers to monitor temperatures of the silicon wafers. The monitored temperatures may be used as input signals for controlling the input power to the infrared lamps.

The shape of the silicon block may be circular or cylindrical or may take in the flat plate form. However, it has been found that the flat plate form is preferable in approximating the real temperature of the wafer surface.

In the embodiment shown in FIG. 3, the silicon blocks 35 and 36 are in the shape of a circular cylinder into which the thermocouples are directly inserted, respectively. Since in this case silicon at room temperature does not abosrb radiation from light having a wavelength longer than about 1.1 μm, these lights will directly heat the thermocouples and therefor the exactness or accuracy of temperature measurement will be lowered. The thermocouple inserted into the circular silicon block preferably takes the form of a sheath type themocouple which is constituted with a thin sheath material having, for example, 0.5 mm to 3 mm and a thermocouple encapsulated therein. Further the sheath material should have a surface which reflects most of the heating radiation. Materials which exhibit reflecton coefficiency nearly equal to 100% in a wide wavelength range from 0.3 μm to 5 μm may be Au or Al. However, the melting points of these materials are low for a high temperature measurement. Therefore, for the measurement up to around 1,200° C., a $P_t R_H$ thermocouple which has a sheath of $P_t$ or $P_t$-$R_H$ which well reflects lights having wavelength longer than about 1 μm may be preferable.

In the embodiment shown in FIGS. 1 and 3, the lamps 17 are arranged orthogonally of the lateral type reaction tube, i.e., orthogonally of the gas flow. The length of each of the parallel lamps and the number of the lamps depend upon the number of the wafers and the diameter of each wafers to be processed simultaneously.

Figure 4:
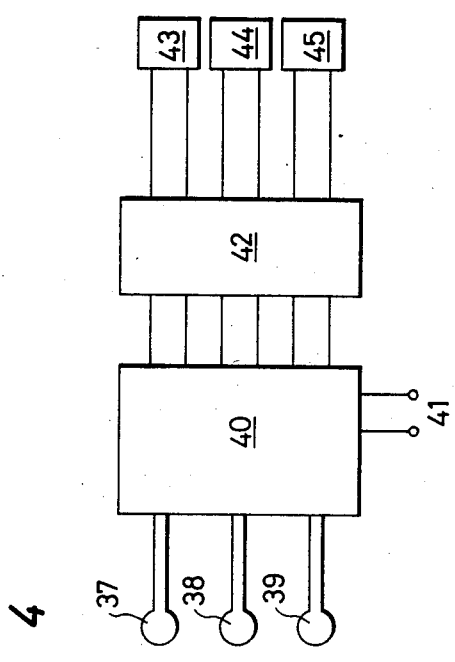
FIG. 4 is a block diagram showing a control system for the infrared heating-ultra-violet irradiating furnace.

FIG. 4 shows a block diagram of a control system for controlling the parallel lamps grouped into three zones, i.e., an upstream zone, a center zone and a downstream zone. Thermocouples 37, 38 and 39 are assigned to these three zones, respectively, and outputs of these thermocouples are connected to a programmed temperature controller 40 so that electromotive forces are compared with reference values to control heating inputs to the lamp groups 43, 44 and 45 through a transformer 42. A reference numeral 41 depicts lead wires to an A.C. power source. In the system in FIG. 4, the lamps arranged above and below each of the three regions are controlled together. It should be noted, however, it is possible to control the upper lamps and lower lamps for that region independently by increasing the number of outputs of the control system or it is possible to perform a zone control of the three regions with 9 fixed ratios of input powers to the upper lamps and the lower lamps. The number of regions is not critical. Further, it is possible, of course, to control the lamps individually.

The main feature of the present infrared heating, ultra-violet irradiating furnace is that the infrared radiation and the ultra-violet radiation are simultaneously and uniformly performed.

The reflecting block 18 is made of aluminum and the inner surface 15 thereof is gold plated or coated with Al-MgF. For a reflection of ultra-violet ray having wavelength of 1500 Å to 3000 Å, it may be advisable to further provide an Al-MgF$_2$ coating thereon.

The infrared lamps 19 and the infrared-ultra violet lamp 17 will be described in detail.

Figure 5A:
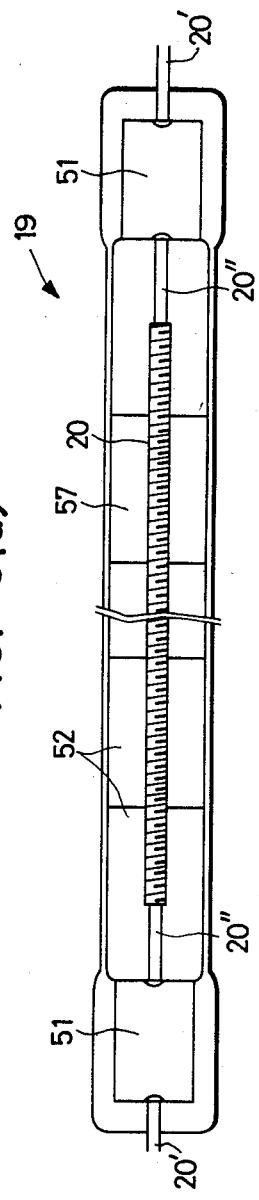
FIGS. 5a and b show examples of infrared and ultra-violet lamp structures, respectively, used in cooperation in the furnace of the present invention.
Figure 5B:
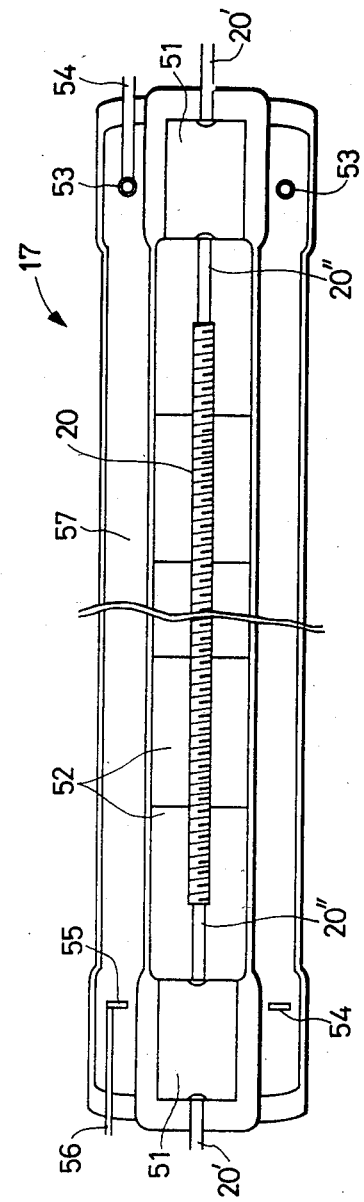

FIG. 5a shows an infrared ray lamp 17 and FIG. 5b shows an infrared ultra-violet ray lamp 19. The infrared lamp 17 is constituted basically with a quartz tube 57 and the tungsten filament 20 inserted therein. The diameter of the quartz tube 57 is in the order of 5–30 mm and the length thereof is 5 cm to 60 cm dependent upon applications. It may be possible to use a longer tube, e.g. 1 m or more. In order to improve the uniformity of heating, however, it is preferable to use thinner tubes. The tungsten filament is formed by intimately winding a tungsten line having a diameter of about 0.1 mm to about 0.5 mm and length of about 1 mm to about 3 mm. In order to prevent the filament from contacting the tube wall when heated, spacers 52 in the form of molybdenum, tungsten or tantalum plate are disposed with a desired pitch, e.g. 2-5 cm. To provide an air-tight structure, the lead electrode 20' is connected though a thin molybdenum plate 51 to the filament. With the provision of the thin plate 51, the difference in thermal expansion between the quartz tube end the thin plate 51 can be kept small even if the lamp itself becomes high temperature. A tungsten or molybdenum lead 20" having thickness of 1-2 mm which is substantially thicker than the tungsten filament 20 is inserted between the filament and the thin plate 51. If the line 20" is too thin, its temperature will be increased by an electric current flowing there through if and if it is too thick, the heat of the tungsten filament may flow though the lead wire 20" causing the temperature of a peripheral portion of the filament to be lowered and the temperature of the lead wire and hence the contacting portion between the plate 51 and quartz to be increased causing the lamp life to be shortened.

In order to eliminate the tendency of lowering the temperature around the opposite ends of the filament, the winding pitch of the filament at the opposite ends thereof is made shorter so that the resistance distribution of the filament becomes uniformly low in the center portion thereof and high around the opposite ends portions thereof.

In the direct heating system of the semiconductor wafers, effective heating is only possible when lights having radiation energy higher than the band gap of the semiconductor. For silicon, lights having wavelength shorter than 1.1 $\mu$m at room temperature may be used. Since the higher the wafer temperature is the narrower the band gap, lights having longer wavelength may produce the heating effect. In any case, lights which contain mainly short wavelength components and do not substantially contains components having wavelength longer than about 3 $\mu$m which directly produce the heating of the quartz may be usable. Regardless of the power to be supplied to the filament, the radiation temperature of the filament should be set high, e.g., higher than 3,000° K.

The infrared-ultra-violet lamp may be constituted as a combination of a parallel arrangement infrared lamp and an ultra-violet lamp so long as they can provide simultaneous and uniform radiation of infrared and ultra-violet rays directed to the silicon wafers. In the latter case, however, it is necessary to make longer the distance between the lamps and the wafers, otherwise the uniformity of irradiation will be lost. With the longer distance therebetween the heating efficiency and irradiation efficiency will be remarkably lowered. In the lamp shown in FIG. 5b, the infrared lamp and the ultra-violet lamp are coaxially arranged to form a unit lamp structure. The infrared lamp having similar structure to that shown in FIG. 5a constitutes an inner portion of the unit lamp and a discharge tube constituting the ultra-violet lamp is arranged outside the infrared lamp. In FIG. 5b, numerals 53,54, 55, and 56 depict a cathode, a lead wire connected to the cathode, an anode in the form of tangsten or molybdenum ring plate, a lead wire connected to the anode and a quartz tube having a discharge space, respectively. The discharge space of the quartz tube 57 is filled with at least one kind of gas at 0.1-10 Torr which is capable of radiating ultra-violet rays of a desired wavelength. The gas or gases should be well purified. The wavelengths of light to be emitted by the gases are as follows:

Argon: 2754 Å, 2745 Å, 2708 Å, 2647 Å, 2517 Å, 2516 Å

Xenon: 2677 Å, 2606 Å, 2476 Å

Krypton: 2428 Å, 2418 Å, 2376 Å, 2316 Å, 2288 Å, 2283 Å

Mercury: 2967 Å, 2925 Å, 2893 Å, 2848 Å, 2753 Å, 2655 Å, 2654 Å, 2652 Å, 2537 Å, 2464 Å, 2447 Å, 2399 Å, 2225 Å, 1875 Å

Neon: 2647 Å

Helium: 2945 Å, 2829 Å, 2764 Å, 2733 Å, 2723 Å, 2511 Å, 2385 Å, 2306 Å, 2253 Å

Deuteron: 2400 Å

Other gases than the above may be used if they emit light having wavelength of about 500 Å to about 3000 Å. It may be desirable to use a plurality of gases to improve the emission efficiency. The discharge tube is generally operated with D.C. discharge and at the start of discharge a pulse voltage is applied thereto. The voltage drop of the discharge tube in the stationary discharge state may be 10 to several times 10 volts dependent upon the shape of the tube and the gas used.

It may be advisable to use in combination an ultra-violet emitting gas and an inert gas having a metastable energy level which is slightly higher than the ultra-violet radiation level of the emitting gas. When a plurality of ultra-violet rays are required, it may be possible to cause the corresponding number of gases capable of emitting the required rays, respectively. The metastable level and the ultra-violet emission levels may be determined by using a Grotrian diagram (see S. Boskin and J. O. Stoner, "Atomic Energy Buel and Grotrian Diagram", North-Holland Pub. Co. 1975). The so-called hollow cathode lamp filled with Ne or Ar etc. may be also effective.

When the infrared lamp and the ultra-violet lamp can be manufactured as having diameter of 1 cm or less, it may be possible to arrange them alternately. In such case, the reflecting surface should be constructed so that light intensities from these lamps are uniform on the wafers. The alternately arranged lamps should be reciprocated periodically along the reaction tube for a distance equal to about 10 times the pitch of the alternative lamp arrangement.

In operation, the wafers are washed and completely cleaned. After the wafers are completely dried, they are put on the support 12 of quartz or sapphire and the support 12 is disposed in a predetermined position in the reaction tube 11. After the reaction tube is evacuated once, purified hydrogen gas is introduced into the tube 11 to replace the atmosphere in the tube by the hydrogen gas completely. When, in setting the wafers in the tube, it is possible to isolate the wafers from atmosphere by providing a nitrogen box at an inlet of the tube for the silicon wafer insertion, there is no need of evacuation and it is enough to supply hydrogen gas.

Then the infrared heating is started to heat the wafers. Thereafter HCl is mixed in hydrogen gas at a ratio of 1% or less to clean the surfaces of the silicon wafers and then the material gas is introduced to start the epitaxial growth.

The preheating furnace for gas is actuated prior to the introduction of the material gas. As mentioned before, regardless of which gas system, $SiCl_4 + H_2$ or $SiH_4 + H_2$, is used, the epitaxial growth can be achieved at a temperature lower by 100°-200° C. than the conventional epitaxial growth temperature, with an aid of ultra-violet irradiation from mercury discharge lamp. Since, according to the present invention, the lowering of the surface temperature of the wafers due to the gas flow can be compensated by controlling the amount of the infrared heating from the upper side of the reaction tube, the temperature distribution in the wafer can be kept uniform and it is possible to obtain high quality crystal having substantially no effect of inner stress in the wafers. Further, since there is substantially no portion having high temperature other than the silicon wafers which is heated to a high temperature, there are little of contaminations if any caused from the reaction tube, the support and the susceptor, if any resulting in the high quantity crystal. The crystal grown layer having impurity density of $10^{13}$–$10^{15}$ cm$^{-3}$ and carrier life of several 100 μsec to several m sec have been easily obtained by this invention.

Since there is very little contamination caused from the components in the reaction tube, the purifications of hydrogen gas, material gas and dopant gas are highly required in order to obtain high quality growth layer. To this end, the use of high quality valves in the gas pipings and the reduction of the number of the valves by utilizing weldings are to be considered. Further it is recommendable that after the pipings and valves are completed, they are baked up to 120° C.-200° C. in purified hydrogen or in vaccum to remove gas components contained in walls of the pipes. In order to decrease the gas components from the wall, they are coated by metals such as Ni, Au, etc. due to plating. The pipings, valves and filters etc. should be made of metal and they should be grounded to prevent electrostatic charge-up phenomena due to the gas flow. This is due to the fact that when a filter (e.g. 0.2 μm) made of insulative material is used, electrostatic charge-up becomes several 100 KV which causes local discharges even at the normal gas pressure, resulting in contamination. Even if the whole piping is constituted with electrically conductive material, the reaction tube is easily charged to several 10 KV due to the gas flow because the reaction tube and the support are of insulative materials and such charge-up affects the uniformity and quality of the grown layer adversely. If local discharge occurs, it causes contaminations necessarily.

In order to eliminate such phenomena, the reaction tube and the support should be made of electrically conductive material. However, there is no conductive material suitable for this purpose at present. One approach to partially resolve the problem may be to provide by CVD a conductive silicon nitride membrane on the entire surfaces of the inner wall of the reaction tube and the support. Using CVD with a $SiCl_4 + NH_3 + C_3H_8 + H_2$ gas mixture, a silicon nitride layer containing carbon (0.1-5 weight %) is formed, which exhibits an electric conductivity. With using this technique it is possible to prevent the charge-up of the reaction tube to thereby obtain a uniform and high quality grown layer. It may be possible to provide such coating with $SiH_4 + NH_3 + C_3H_8 + H_2$ gas. Further, in order to obtain a superior grown layer at a low temperature, the following process is utilized. Firstly gas components contained in the pipings, valves and the reaction tube are completely removed. The pipings and the reaction tube are cleaned by purified HCl gas. Then the silicon wafers are washed to prevent carbon contamination and a thin oxide layer of several Å is provided on the silicon surface by high temperature washing with $HCl + H_2O_2 + H_2O$. The wafers having the oxide layers are washed by purified water and dried. Thereafter the wafers are dispersed in the reaction tube. After the interior of the reaction tube is evacuated, the wafers are irradiated with ultra violet ray to remove water content adsorbed therein.

Under a conduction where a sufficient amount of nitrogen gas flows between the walls of the double walled reaction tube to cool the walls, the wafers are heated by the infrared lamps to a temperature of about 750° C.-800° C. and maintained at the temperature for 30 minutes at a pressure of $1 \times 10^{-8}$ Torr to completely evaporate the oxide layer thereon. After the wafer surfaces are cleaned, the temperature of the wafers is maintained at a desired temperature and Si epitaxial growth is started by introducing sufficiently purified $H_2 + SiH_4$ gas or $H_2 + SiH_2Cl_2$ gas into the reaction tube with ultra-violet irradiation onto the wafers. It has been formed that high quality Si crystal is obtained at a temperature around 900° C. It may be possible to further lower the temperature.

The silicon wafers are dispersed on the flat support 12 in FIG. 1 and so when the wafers are heated, the temperature of the support 12 is also raised.

Figure 6:
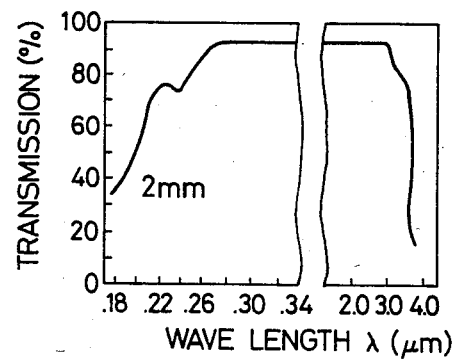
FIG. 6 is a graph showing the wavelength dependency of light transmission for super high purity quartz.
Figure 7:
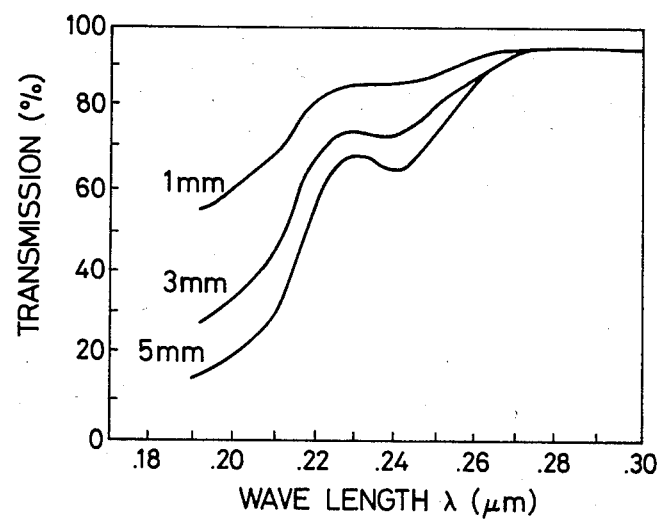
FIG. 7 is a graph showing the transmission of ultra-violet ray for super high purity quartz.

FIGS. 6 and 7 are graphs showing light transmission coefficient of super high purity quartz. In FIG. 6, the transmission coefficient of super high purity quartz plate having thickness of 2 mm for lights having wavelength of 0.18 μm to 4.0 μm is shown. Lights having wavelengthes shorter than 0.3 μm and longer than 3 μm are absorbed thereby. The transmission coefficient for wavelength of 0.3-2.5 μm is 95%. This is due to not absorption but reflection. FIG. 7 shows transmission coefficients of quartz plates having thickness of 1 mm, 3 mm and 5 mm for lights having wavelengthes shorter than 0.3 μm, respectively. In FIG. 7, it is clearly shown that lights whose wavelength is shorter than 0.17 μm are absorbed by the quartz plates. The lower the transmission coefficient is the thicker the quartz plate.

Figure 8:
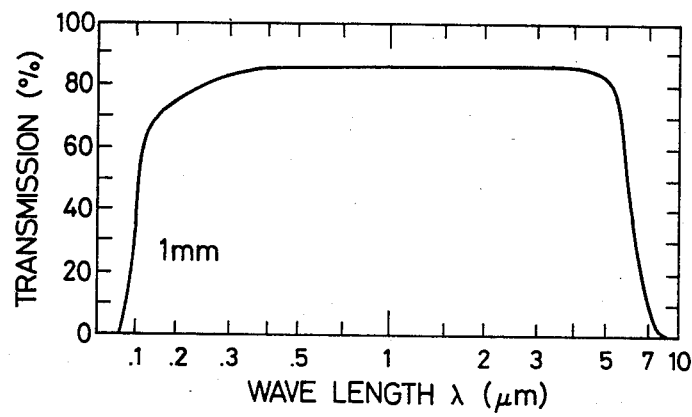
FIG. 8 is a graph showing the wavelength dependency of light transmission for super high purity sapphire.

FIG. 8 shows the light transmission coefficient of a sapphire plate whose thickness is 1 mm. Lights whose wavelengthes are in the order of 0.3 μm to 5 μm are not absorbed by the sapphire plate. The lowering of the transmission coefficient is due to reflection. For lights whose wavelength are shorter than 0.3 μm, the absorption increases gradually, and for lights shorter than 0.15 μm, the absorption becomes drastic.

Figure 9:
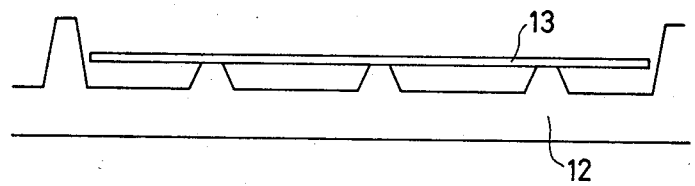
FIG. 9 is a cross section of a dish formed with protrusions.

When the increase of the support temperature becomes a problem, it may be advisable to provide protrusions on the surface of the support 12 to substantially reduce the contact area between it and the wafers 13 thereon as shown in FIG. 9. The distance between adjacent protrusions results in the smaller heat flow from the wafer to the support and hence the smaller the temperature increase of the support. However, when the distance is too large, the distortion problem of the wafer occurs because the wafer is softened at high temperature and easily deformed. With the use of the support having such protrusions, a non-uniform temperature distribution may occur because conduction heat flows only through contact portions between the wafer and the protrusions. If such temperature distribution is undesired, it is advisable to coat the support with $Si_3N_4$ coating.

The formation of thermal oxide layer will be described. With semiconductor device becoming smaller and smaller, the thickness of, particularly, the gate oxide layer or gate nitride layer of a MOS transistor must be smaller, otherwise it is impossible to make the trans-conductance large and hence to improve the characteristics of the device. It has been known that it is very difficult generally to produce a uniform and high quality thermal oxide layer having thickness less than 100 Å with high reproducibility. The formation of oxide film whose thickness is smaller than 100 Å can be analysed by using the field assisted diffusion model of Mott and Cabarera. That is, electrons move from a Si substrate through a $SiO_2$ layer to $O_2$ molecules adsorbed by the $SiO_2$ surface by the tunnel effect so that the chemical potentials of $O_2$ molecules and the silicon substrate becomes coincident. Therefore, $O_2$ molecule is charged negative, resulting in a potential difference between opposite ends of the $SiO_2$ layer. The potential difference is said as being several 100 mV. Assuming that the thickness of a layer under growth is 30 Å and the potential difference is 300 mV, the field intensity applied to the oxide layer is $10^6$ V/cm. $O_2$ anions drift under this field intensity and reach the silicon surface where $SiO_2$ is produced by a reaction thereof with silicon. With this oxide layer producing mechanism, the phenomenon that the $SiO_2$ surface is randomly charged by the gas flow may be an important factor in making the $SiO_2$ layer production non-uniform.

In the infrared heating-ultra-violet irradiating furnace of the present invention the random charging of the oxide layer is restricted and uniform and high quality oxide layers having thickness of 100 Å or smaller can be produced.

Silicon wafers are inserted into the reaction tube as shown in FIG. 1. Each of the silicon wafers except portions on which desired gate oxide layers are formed is previously covered by thick field oxide membrane. In this case, contrary to the epitaxial growth, there is no need of use of the inclined support 12 as shown and a flat arrangement of the support 12 is usable. The gas 14 is dried $O_2$ gas diluted with an inert gas such as $N_2$ or Ar, and a combination of $H_2$ and $O_2$. When oxidation is performed by using hydrochloric acid, hydrogen chloride (HCl) of 1-7% with reference to dried $O_2$ is mixed in. Since even purified $O_2$ gas contains usually $N_2$, Ar, $CH_4$, Halogen, $N_2O$, $CO_2$, CO, hydrocarbon and $H_2O$ etc. it is passed through a platinum catalyst tube or an adsorbing tube of zeoport or zeoharp which is an adsorbent containing molecular sheaving carbon and zeolite to remove undesirable gas components thereof. The water component usually contained in HCl gas is also removed by using the adsorbent such as zeoharp.

The silicon wafers are heated by the infrared ray to a temperature of about 800° C.–1100° C. and the surfaces thereof are oxidized in a high purity oxidizing atmosphere. As will be seen from FIG. 7, $SiO_2$ absorbs ultra-violet ray having wavelength shorter then 2600 Å, the higher the absorption of the shorter the wavelength. With ultra-violet ray absorbed, $SiO_2$ becomes slightly conductive. Therefore, even if $SiO_2$ surface is electrostatically charged by the gas flow etc., the charge may immediately flow through the thin $SiO_2$ layer to the silicon wafer, leaving potentials necessary to make the chemical potential of the silicon substrate and the $SiO_2$ surface constant. Therefore the $SiO_2$ layer can be produced uniformly and at a controlled speed. In order to control the oxidation speed, it may be effective to flow simultaneously an inert gas such as He, Ar and Xe etc. Helium whose boiling point is 4.2° K. can be made as a high purity gas if the pipings have no leakage problem. Further it may be advisable to etch the Si surface with using gaseous HCl immediately prior to the oxidation. As mentioned before, with the present apparatus the wafers are heated from both surface sides thereof and so the temperature gradient inside the wafer can be minimized. Therefore, the oxidation can be performed without the effect of the inner stress of the wafers. Thus, with using the present apparatus, not only the thermal oxide layer less than 100 Å, but also oxide layer having thickness up to 1000 Å can be produced by either the dry oxidation or the wet oxidation influenced by $H_2O$ and the resulting oxide layer is of uniform and high quality and has low interface state density and substantially no OSF.

The present infrared heating-ultra-violet irradiating furnace is also effectively applicable to the thermal nitridation in the system of a mixture gas of $H_2+NH_3$ or a mixture gas of $NH_3$ and an inert gas such as He, Xe or Ar.

Since a large number of electron-hole pairs are produced in the vicinity of the silicon surface by radiations from the infrared lamps and the ultra-violet lamps and that portion is in the state similar to that of metal, the bonds of Si around that portion tend to be easily cut. That is, the Si surface irradiated is very active. If the thickness of the oxide layer is small, oxygen drifts in the oxide layer by an electric field and therefore, there is no need of thermal energy for supplying oxygen. Energy is only required for the reaction with Si at the surface portion and thus, for the thin oxide layer, high quality oxide layer can be produced at low temperature.

As explained for the epitaxial growth, the higher quality oxide layer can be produced at low temperature by preliminarily evacuating the reaction tube to evaporate the oxide membrane on the Si to thereby clean the surface. To enhance the reaction temperature lowering, it may be effective to adsorb $O_2$ anion in the Si surface.

The present infrared heating-ultra-violet irradiating furnace can be effectively applied to the CVD of $Si_3N_4$ etc. Gases such as $SiH_4$, $N_2O$ and $NH_3$ etc. which constitute the material gas are usually decomposed by absorbing ultra-violet ray having wavelength shorter than 2200 Å, particularly, shorter than 2000 Å. Therefore, by forming the ultra-violet lamp and the reaction tube of material or materials whose light transmission are higher than that quality, it is possible to decompose the material gas directly by ultra-violet irradiation to thereby promote the reaction. For example, when it is desired to obtain $SiO_2$ membrane by using a gas containing $SiH_4+N_2O$ or $SiH_4+O_2$, the gas is decomposed by an irradiation of ultra-violet ray whose wavelength is 1700 Å–2000 Å as follows. $N_2O+h\nu\rightarrow N_2+O('D)$ and the separated O (oxygen) reacts with $SiH_4$ resulting in $SiO_2$ membrane. In this case, a discharge tube filled with $N_2$ gas or a hollow cathode lamp filled with Ne and having a cathode of As or carbon may be used as the ultra-violet lamp.

As another method, mercury vapor is mixed in the material gas and mercury is excited from the ground state to the excited state by ultra-violet ray (2537 Å) from a mercury lamp so that the excited mercury reacts with the material gas to obtain the desired membrane deposition.

For example, $$Hg + h\nu(2537 \text{ Å}) \rightarrow Hg^*$$

$$Hg^* + N_2O \rightarrow N_2 + O(^3P) + Hg$$

$O(^3P)$ is oxygen in the ground state and reacts with SiH$_4$ to produce SiO$_2$ deposition. The pressure of the material gas in the reaction tube is usually maintained at a level on the order of several Torr. Thus, when mercury gas which acts similarly to a catalyst fills the reaction tube, the ultra-violet lamp used should be filled with Hg gas so that an efficient Hg excitation can be achieved. The Si$_3$N$_4$ membrane deposition process may be as follows:

$$Hg + h\nu(2537 \text{ Å}) \rightarrow Hg^*$$

$$Hg + SiH_4 \rightarrow SiH_3 + H + Hg$$

$$Hg^* + NH_3 \rightarrow NH_2 + H + Hg$$

SiH$_4$ and NH$_2$ thus produced react with each other to produce Si$_3$N$_4$. In this manner, the light excited CVD process can be performed at the silicon wafer temperature of 100° C.–200° C. Therefore it is very convenient compared with the conventional process, in that the impurity distribution and the existence of Al as electrode materials do not substantially affect the process. The properties of the produced membrane can be improved by annealing at 400°–450° C.

This invention can also be applied to the MOCVD (metal organic chemical vapor deposition). GaAs can be epitaxially grown by a reaction in a gas containing (CH$_3$)$_3$Ga+A$_5$H$_3$+H$_2$. That is, while irradiating the GaAs substrate surface with ultra-violet ray from discharge tube containing such as Hg, He, D$_2$ (deuteron) or Xe etc., a gas which is the same as the gas filling the discharge tube is added to the raw material gas. That is commonly applicable to the MOCVD of AlN by using (CH$_3$)$_3$Al+NH$_3$+H$_2$.

In the embodiment in FIG. 1, a number of the parallel lamps are arranged orthogonally of the gas flow direction of the laterally arranged reaction tube. With this structure, using lamps each being 60 cm long, 4 wafers each having diameter of 4" can be arranged orthogonally of the gas flow and thus 20–40 wafers or more can be processed simultaneously dependent upon the number of the lamps.

Figure 10:
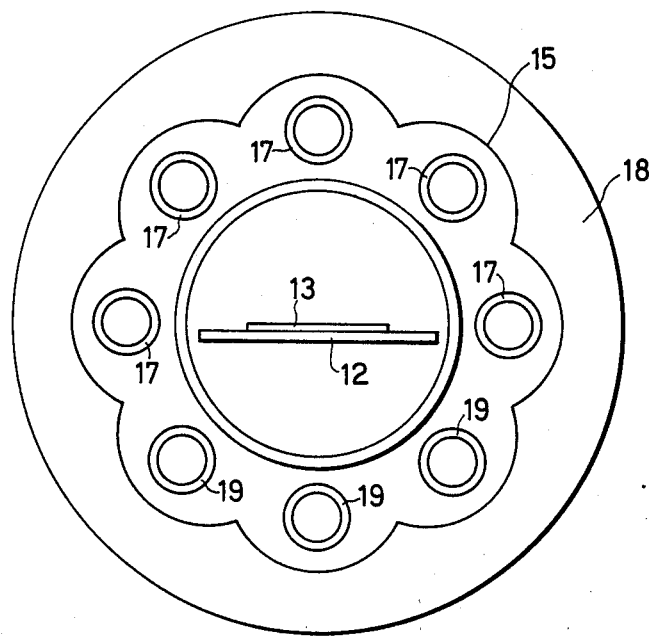

Although the number of wafers to be processed simultaneously may be decreased comparing with the lateral system shown in FIG. 1, it is possible to arrange the lamps in parallel to the gas flow such that the lamps encircle the latter. An example thereof is shown in FIG. 10 in which the same or similar components to those in FIG. 1 are depicted by the same reference numerals, respectively.

The infrared lamps 19 and the infrared-ultra-violet lamps 17 are arranged in parallel to and coaxially around the reaction tube into which the support 12 having the wafers 13 thereon is inserted. In this case, it is impossible to externally control the temperature distribution in the gas flow direction. Therefore, it may be necessary to provide a desired resistance distribution of the tungsten filament by changing the winding pitch thereof.

In this embodiment, to improve the uniformity of the membrane to be grown, it may be effective to reciprocatingly rotate the heating furnace periodically. It is, of course, possible to use alternately arranged infrared and ultra-violet lamps.

Figure 12:
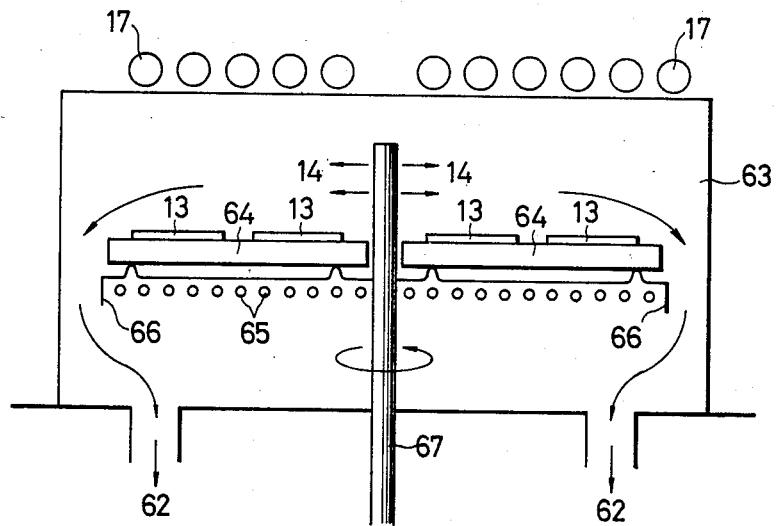
FIG. 12 is a schematic illustration of a disc type furnace according to the present invention equipped.
Figure 11:
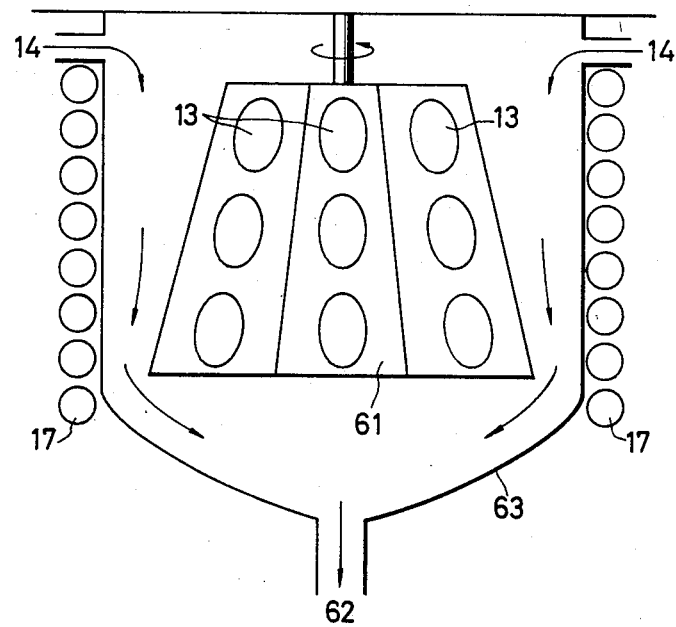
FIG. 11 is a schematic illustration of a barrel type furnace according to the present invention equipped.

Although the embodiments described heretofore utilize the lateral type reaction tube, the invention can be applied equally to a barrel type or disc type furnace. FIGS. 11 and 12 show embodiments utilizing the barrel type furnace and the disc type furnace, respectively.

In FIG. 11, the barrel type furnace includes a bell jar 63 of quartz, a high purity silicon susceptor 61 and an exhaust gas outlet 62. That is, the semiconductor wafers are disposed on the silicon susceptor provided in the quartz bell jar and are heated and irradiated by the infrared heating-ultra-violet irradiating lamps provided outside the bell jar to promote the reaction. A reflecting member (not shown) is provided for the lamps. In order to improve the uniformity, the susceptor is rotated during the epitaxial growth.

The barrel type furnace in FIG. 11 is basically cylindrical. Therefore, the lamps 17 should take a circular configuration, the manufacture of which is relatively difficult. It may be advisable to use the lamps 17 of straight configuration arranged in parallel and vertically around the barrel. Since the support having the wafers thereon is rotated, it may be effective to use thin infrared lamps and thin ultra-violet lamps and arrange them alternately. With the structure in which the wafer support is rotated, there is a problem of gas leakage. In order to eliminate this problem it may be possible to make the support stationary and instead thereof the lamps are reciprocatingly rotated around the barrel. By doing so, there is no gas leakage and thus higher quality membrane can be obtained. The susceptor 61 can be formed of quartz or sapphire rather than Si.

FIG. 12 shows the disc type furnace in which reference numerals 64, 65, 66 and 67 depict a carbon susceptor coated with SiC, a high frequency spiral coil, a quartz or sapphire jig and a rotatable piping of stainless steel for uniformly supplying material gas, respectively. If contamination due to evaporation of SiO$_2$ from the quartz jig at an elevated temperature is problem, the jig may be coated by Si$_3$N$_4$ or the jig may be made of sapphire. The carbon susceptor and hence the wafers 13 are induction-heated by high frequency of 100 KH$_z$–10 MHz. The wafers 13 are also heated by the infrared-ultra-violet lamps 17 to restrict the gas cooling effect on the wafer surface. A reflecting member (not shown) is provided above the lamps 17.

In this embodiment, it is also effective to arrange the infrared lamps and the ultra-violet lamps alternately and to periodically reciprocate them within a distance about 10 times the pitch of the lamps.

The infrared-ultra-violet lamps 17 each shown in FIG. 5b are effectively used in this embodiment. However, the lamps are not always constructed coaxially. It may be possible to constitute the infrared-ultra-violet lamp by dividing a circular or ellipsoidal quartz tube into two chambers by a quartz plate and providing an infrared lamp in one of the chambers and a ultra-violet lamp in the other so long as the wafer surface can be irradiated with infrared and ultra-violet rays uniformly.

Further, in the embodiments described hereinbefore, the wafers are disposed intimately on the support of quartz or sapphire or silicon susceptor or carbon susceptor provided thereon. For the oxidation, nitridation or CVD, it may be possible to use a quartz or sapphire support having grooves and stand the wafers obliquely on the grooves so long as the surfaces of the wafers are uniformly irradiated with infrared and ultra-violet rays.

When the wafer temperature is as high as 100°–200° C. as in the SiO₂ CVD or Si₃N₄ CVD, the stress problem due to temperature difference caused by the gas cooling effect is not so severe. Therefore, in such case the infrared-ultra-violet lamps 17 of the embodiment in, for example, FIG. 1 may be replaced by ultra-violet lamps. On the other hand, when the wafer temperature higher than about 700° C. is required, it is preferable to employ infrared and ultra-violet unit lamps such that the lowering in surface temperature of the wafer is compensated by irradiation of infrared rays whereas physical changes or reactions are accelerated by irradiation of ultra-violet rays. Further, it is of course, possible to use alternately arranged infrared and ultra-violet lamps so as to carry out uniform irradiation.

As described above, with a semiconductor fabricating apparatus according to the present invention, it is possible to uniformly irradiate with infrared rays for heating and ultra-violet rays the wafer surface of a semiconductor in which epitaxial growth, thermal oxidation, thermal nitridation, and CVD membrane growth occur. As a result, high quality growth or oxidation at a low temperature is possible. This is very valuable in an LSI or VLSI fabricating field in which such a low temperature processing is required.

What is claimed is:

1. A semiconductor fabricating apparatus comprising a reaction chamber having a gas inlet and a gas outlet, a support means disposed in said reaction chamber for supporting semiconductor wafers thereon, an infrared lamp means for irradiating exposed surfaces of said semiconductor wafers and an ultra-violet lamp means for irradiating said exposed surfaces of said semiconductor wafers overlappingly with said infrared irradiation, further comprising a vacuum means connected to said reaction chamber for evacuating an interior of said reaction chamber to maintain an inner pressure thereof at a super low pressure prior to a commencement of reaction.

2. The semiconductor fabricating apparatus as claimed in claim 1, wherein said infrared lamp means and said ultraviolet lamp means are disposed with respect to said semiconductor wafers so that the irradiations of said exposed surfaces of said semiconductor wafers with infrared rays and ultra-violet rays occur simultaneously.

3. The semiconductor fabricating apparatus as claimed in claim 1, wherein said infrared lamp means and said ultra-violet lamp means are constituted as a unit so that said surfaces of said semiconductor wafers are irradiated uniformly with infrared rays and ultra-violet rays.

4. The semiconductor fabricating apparatus as claimed in claim 1 wherein said ultra-violet lamp means and said infrared lamp means are constituted as a unit and are positioned above said wafers as a first source of illumination, said apparatus further comprising additional infrared lamp means positioned below said wafers as a second source of illumination.

* * * * *